United States Patent [19]

Belanger et al.

[11] Patent Number: 5,049,521
[45] Date of Patent: Sep. 17, 1991

[54] METHOD FOR FORMING DIELECTRICALLY ISOLATED SEMICONDUCTOR DEVICES WITH CONTACT TO THE WAFER SUBSTRATE

[75] Inventors: Richard H. Belanger, El Toro; Sang S. Kim, Laguna Hills, both of Calif.

[73] Assignee: Silicon General, Inc., Garden Grove, Calif.

[21] Appl. No.: 444,051

[22] Filed: Nov. 30, 1989

[51] Int. Cl.⁵ .......................................... H01L 21/76
[52] U.S. Cl. ...................................... 437/62; 437/33; 437/90
[58] Field of Search ...................... 437/62, 67, 33, 90

[56] References Cited

U.S. PATENT DOCUMENTS

| | | | |
|---|---|---|---|
| 3,508,980 | 4/1970 | Jackson et al. | 437/62 |
| 3,575,740 | 4/1971 | Casirucci et al. | 437/62 |
| 3,966,577 | 6/1976 | Hochberg | 437/62 |
| 4,234,362 | 11/1980 | Riseman | 148/187 |
| 4,256,514 | 3/1981 | Pogge | 148/1.5 |
| 4,473,598 | 9/1984 | Ephrath et al. | 427/86 |
| 4,507,158 | 3/1985 | Kamins et al. | 148/145 |
| 4,509,249 | 4/1985 | Goto et al. | 29/576 W |
| 4,530,149 | 7/1985 | Jarstrebski et al. | 437/90 |
| 4,543,706 | 10/1985 | Bencuya et al. | 29/571 |
| 4,554,728 | 11/1985 | Shepard | 29/576 W |
| 4,589,193 | 5/1986 | Goth et al. | 437/62 |
| 4,725,562 | 2/1988 | El-Kareh et al. | 437/67 |
| 4,771,328 | 9/1988 | Malaviya et al. | 357/49 |
| 4,786,960 | 11/1988 | Jeuch | 357/42 |
| 4,810,667 | 3/1989 | Zorinsky et al. | 437/62 |
| 4,819,052 | 4/1989 | Hutter | 357/49 |
| 4,820,654 | 4/1989 | Lee | 437/90 |
| 4,824,795 | 4/1989 | Blanchard | 437/62 |
| 4,825,277 | 4/1989 | Mattox et al. | 357/49 |
| 4,900,692 | 2/1990 | Robinson | 437/67 |
| 4,908,328 | 3/1990 | Hu et al. | 437/90 |

FOREIGN PATENT DOCUMENTS

| | | | |
|---|---|---|---|
| 2300412 | 8/1973 | Fed. Rep. of Germany | 437/62 |
| 0030185 | 3/1977 | Japan | 437/62 |
| 0055877 | 5/1977 | Japan | 437/67 |
| 0146249 | 11/1981 | Japan | 437/62 |
| 0113250 | 7/1982 | Japan | 437/67 |
| 0182149 | 9/1985 | Japan | 437/67 |
| 1106466 | 4/1989 | Japan . | |

Primary Examiner—Olik Chaudhuri
Assistant Examiner—G. Fourson
Attorney, Agent, or Firm—Spensley Horn Jubas & Lubitz

[57] ABSTRACT

A method for forming a dielectrically isolated semiconductor devices on a semiconductor substrate. An epitaxial layer is grown on a wafer having a thin buried oxide layer. Trench regions are etched through the epitaxial layer to the underlying oxide layer. A dielectric isolation layer is formed on the sidewalls of the trench regions so as to isolate an active region of the epitaxial semiconductor material. The trenches are etched to the underlying semiconductor substrate and the semiconductor material is selectively epitaxially regrown in the trench regions. Semiconductor devices are formed in the isolated active regions. Contacts are made to the active regions of the semiconductor device and to the wafer substrate through the epitaxially regrown trench regions.

19 Claims, 6 Drawing Sheets

METHOD FOR FORMING DIELECTRICALLY ISOLATED SEMICONDUCTOR DEVICES WITH CONTACT TO THE WAFER SUBSTRATE

BACKGROUND OF THE INVENTION

1. Field of the Invention

The present invention relates to methods for processing semiconductor devices. More particularly, the present invention relates to methods for forming isolated semiconductor devices on a single substrate.

2. Background of the Prior Art and Related Information

Integrated circuits having a number of semiconductor devices which are dielectrically isolated but formed on a single substrate are of considerable importance for a number of applications. For example, such devices have increased resistance to radiation damage, since charges induced in the substrate by electron/hole pair creation during radiation events will not affect the dielectrically isolated semiconductor devices. Also, dielectrically isolated devices are very suitable for high voltage applications where high voltages applied to portions of the integrated circuit would otherwise cause breakdown effects to occur in neighboring semiconductor devices. Also, dielectrically isolated semiconductor devices integrated on a substrate can generally tolerate higher operating temperatures than more conventional integrated circuit devices.

A conventional approach to providing dielectrically isolated semiconductor devices has beer to start with a substrate of sapphire and then form individual isolated semiconductor devices on the underlying sapphire substrate. This so-called silicon-on-sapphire approach has proved effective but is quite expensive. As a result, in practice silicon-on-sapphire technology has generally been limited to military applications or other applications where high cost may be justified. Also, the silicon-or-sapphire approach to providing dielectrically isolated semiconductor devices requires processing steps which differ from conventional semiconductor processing techniques making it difficult to readily implement with conventional semiconductor processing equipment.

Various approaches have also been developed which attempt to provide partial or complete dielectric isolation of devices formed on a silicon substrate. Silicon as a substrate has several advantages over the use of sapphire. In particular, silicon is cheaper and, since silicon is employed rather than sapphire, conventional semiconductor processing techniques may be employed to simplify device processing. Various such approaches are illustrated, for example, in U.S. Pat. Nos. 4,507,158; 4,824,795; 4,509,249; 4,554,728; 4,543,706; 4,234,362; 4,771,328; 4,725,562; 4,786,960; 4,819,052; 4,825,277; 4,256,514 and 4,473,598. Nonetheless, the aforementioned approaches have not fully exploited the capabilities of isolated devices on a single silicon substrate in a cost effective and readily implemented process.

Accordingly, a need presently exits for an improved method of processing isolated semiconductor devices on a single semiconductor substrate. Additionally, a need presently exists for providing such an improved method within existing semiconductor processing techniques in a reproducible and cost effective manner.

SUMMARY OF THE INVENTION

The present invention provides a method for fabricating dielectrically isolated semiconductor devices on a single semiconductor substrate wherein conventional semiconductor processing techniques may be employed in a cost effective manner.

The present invention further provides a method for forming dielectrically isolated semiconductor devices on a semiconductor substrate wherein the devices have improved resistance to radiation damage and may be operated at increased voltages and temperature than preexisting devices.

The present invention further provides an improved integrated circuit resulting from the aforementioned process. The present invention provides a method for forming dielectrically isolated semiconductor devices on a semiconductor wafer having a buried oxide insulation layer. An epitaxial layer is first formed to : depth suitable for forming the semiconductor devices therein. Trenches are then etched down to the oxide layer so as to form isolation regions of the epitaxial semiconductor material. An oxide insulation layer is then formed on the sidewalls of the trenches so as to dielectrically insulate the isolation regions of the epitaxial semiconductor material. The bottom of the trenches is then etched down to the underlying semiconductor substrate. Epitaxial semiconductor material may then be regrown up from the underlying substrate in the trenches and the epitaxial semiconductor in the trench regions may be utilized to form a contact to the underlying substrate. The active semiconductor devices are formed in the isolation regions of the epitaxial semiconductor material surrounded by the trenches.

The manner in which the semiconductor devices are formed in the isolation regions will vary with the specific device and application. In one specific embodiment, where the semiconductor device is a vertical bipolar NPN transistor, the formation of a portion of the emitter, and/or collector regions may be done before the formation of the trench regions. For example, during formation of the epitaxial semiconductor layer, a suitable dopant may be used to provide a buried layer having an N+ conductivity type. This may be then followed by formation of a second epitaxial layer with an N− conductivity level. After formation of the trench regions and isolation regions, the remaining N+ collector, P+ base and N+ emitter regions may be formed. In a similar manner, vertical diode devices may also be formed or by reversing the conductivity types, vertical PNP devices. In the case of lateral devices formed in the dielectrically isolated regions, the semiconductor device formation steps may typically be conducted after the formation of the trench regions.

The dielectric isolation provided by the semiconductor oxide surrounding the active device regions provides good dielectric isolation of the devices therein and may be increased as desired by increasing oxide thickness. This provides excellent resistance to radiation events which create charges in the underlying substrate. Additionally, the contact provided to the underlying substrate through the semiconductor in the trench regions allows charges introduced during radiation events to be drained off. This prevents the possibility of charge build-up which could ultimately result in device failure. Alternatively, the contact to the underlying substrate may allow the substrate to be used as a common planar electrical connection. Connection of individual devices to this underlying planar contact could then be readily achieved by opening up a portion of the buried oxide layer during the initial process steps. In yet another alternate application, the epitaxial semiconductor in the trench areas may be used to form additional active devices in the trench regions. For example, vertical bipolar devices may be formed therein which could be used as high current vertical devices for high power applications and which could be integrated on a single substrate with lower power devices formed in the dielectrically isolated regions.

It will be appreciated from the foregoing that the present invention provides a method for forming dielectrically isolated semiconductor devices having improved capabilities to resist radiation damage as well as improved capabilities for use in high power devices. It will be further appreciated that the present invention provides a method for forming dielectrically isolated devices wherein the process steps may be readily implanted employing conventional semiconductor processing techniques and with high reliability and at relatively low cost compared to prior art techniques. Further advantages of the present invention will be appreciated by the those skilled in the art from the following detailed description of the invention.

DETAILED DESCRIPTION OF THE INVENTION

Figure 1:
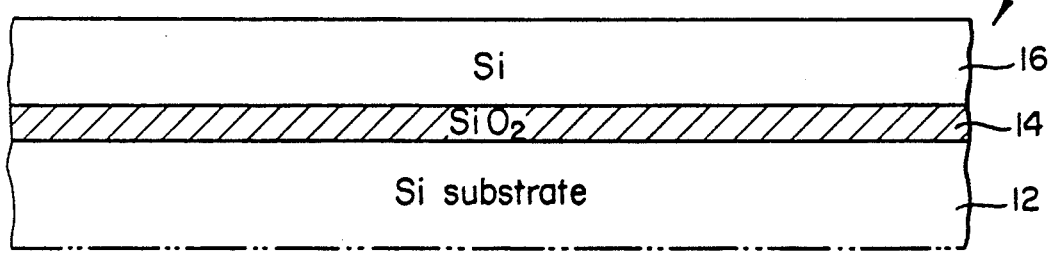
FIG. 1 is a cross-sectional view illustrating a portion of a wafer employed in accordance with the process of the present invention.

Referring to FIG. 1, a portion of a wafer suitable for use with the process of the present invention is illustrated in cross section. The wafer illustrated in FIG. 1 is commercially available and hence may conveniently be employed as a starting point for the process for the present invention. For example, wafers such as illustrated in FIG. 1 are available from Ibis Corp. under the tradename SIMOX; similar wafers are also available from other suppliers. Alternatively, the basic wafer illustrated in FIG. 1 may be created from a pure silicon wafer using either the well known oxygen implant method or the zone melt recrystallization method. Also, while the wafer of FIG. 1 is illustrated in a preferred embodiment employing silicon, it will be appreciated that other semiconductor materials may also be employed.

As illustrated in FIG. 1, wafer 10 includes an underlying silicon substrate 12, a buried layer 14 of insulator, preferably $SiO_2$, and a further epitaxial layer of silicon 16 formed on top of the insulator layer 14. For convenience of illustration, the relative dimensions for the wafer illustrated in FIG. 1 are not drawn to scale. Typical depths of the regions of FIG. 1 are, for example, 400 microns for silicon substrate 12, 4000–10000 Å for $SiO_2$ layer 14, and approximately 2 microns for epitaxial silicon layer 16. The width of the wafer 10 will vary with the number of devices desired to be integrated thereon. For convenience of illustration, a portion of the wafer 10 corresponding only to formation of a single semiconductor device is illustrated.

Figure 2:
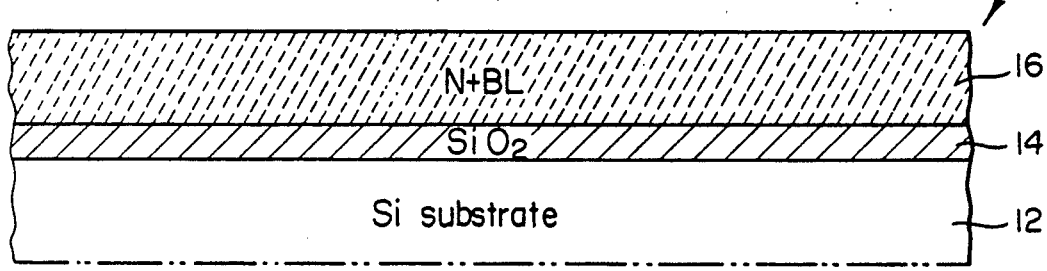
FIG. 2 illustrates the wafer of FIG. 1 after an N+ doping step in accordance with the process of the present invention.

In FIG. 2, wafer 10 is illustrated after a processing step wherein epitaxial silicon layer 16 has been converted to an N+ conductivity type by implantation of a suitable dopant. For example, Sb may suitably be employed as a dopant and may be used to provide a conductivity of approximately 200 $\Omega$/sq. for N+ layer 16. The formation of N+ layer 16 in FIG. 2 is illustrated in an embodiment wherein a vertical NPN bipolar transistor will ultimately be formed and N+ layer will constitute a buried layer in the final vertical device structure. It will be appreciated by those skilled in the art, however, that a P+ buried layer may be employed for formation of different conductivity type semiconductor devices, and combinations of N+ and P+ buried layers may be formed on different portions of wafer 10 as desired to allow different semiconductor devices to be formed in the different regions of wafer 10. Additionally, for applications where lateral semiconductor devices are desired to be formed on wafer 10 or wherein MOS devices or combinations of MOS and bipolar devices are to be integrated on a single wafer 10, the highly doped buried layer 16 may be employed only in portions of wafer 10 or may be dispensed with. Accordingly, the following discussion should be appreciated as being for illustrative purposes and wide variety of semiconductor devices to be formed on wafer 10 will result in suitable modifications of this and subsequent processing steps.

Figure 3:
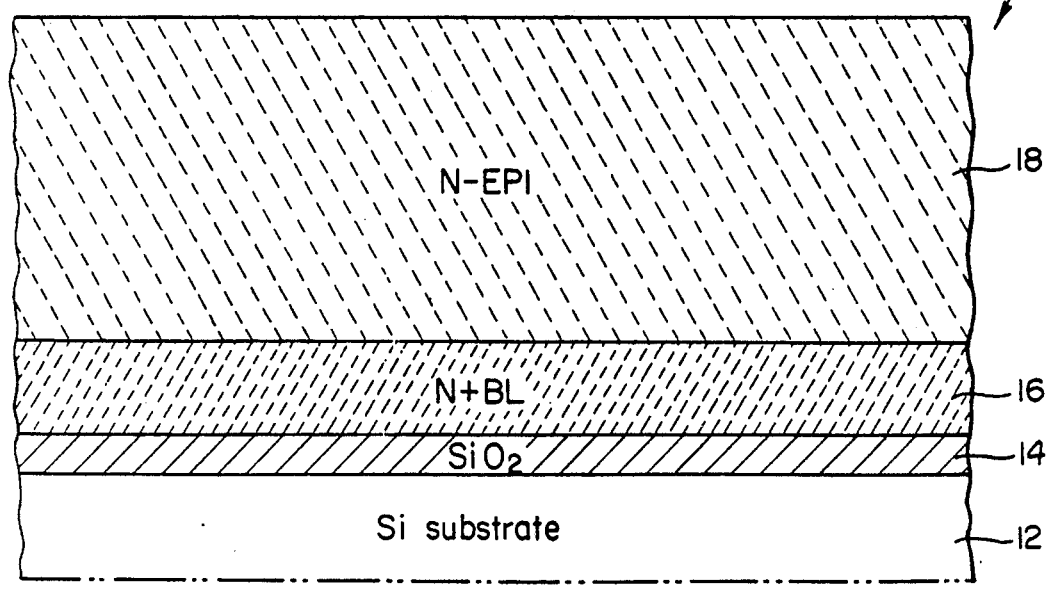
FIG. 3 illustrates the wafer after formation of a second epitaxial layer in accordance with the process of the present invention.

Referring to FIG. 3, wafer 10 is shown after the formation of a second epitaxial layer of silicon 18 on top of the N+ buried layer 16. Second epitaxial layer 18 is formed to a depth sufficient to allow the desired semiconductor device or devices to be formed in the combined epitaxial layers 16 and 18. For example, a depth of approximately 7 microns or more for layer 18, results in a depth of 9 microns which is suitable for a number of semiconductor device geometries. Typically, the combined depth of layers 16 and 18 will be less than 50 microns and more typically less than 15 microns. Second epitaxial layer 18 is preferably deposited with a suitable dopant to give rise to an N− concentration and, for example, a resistance in the range of 2-3 Ω-cm.

Figure 4:
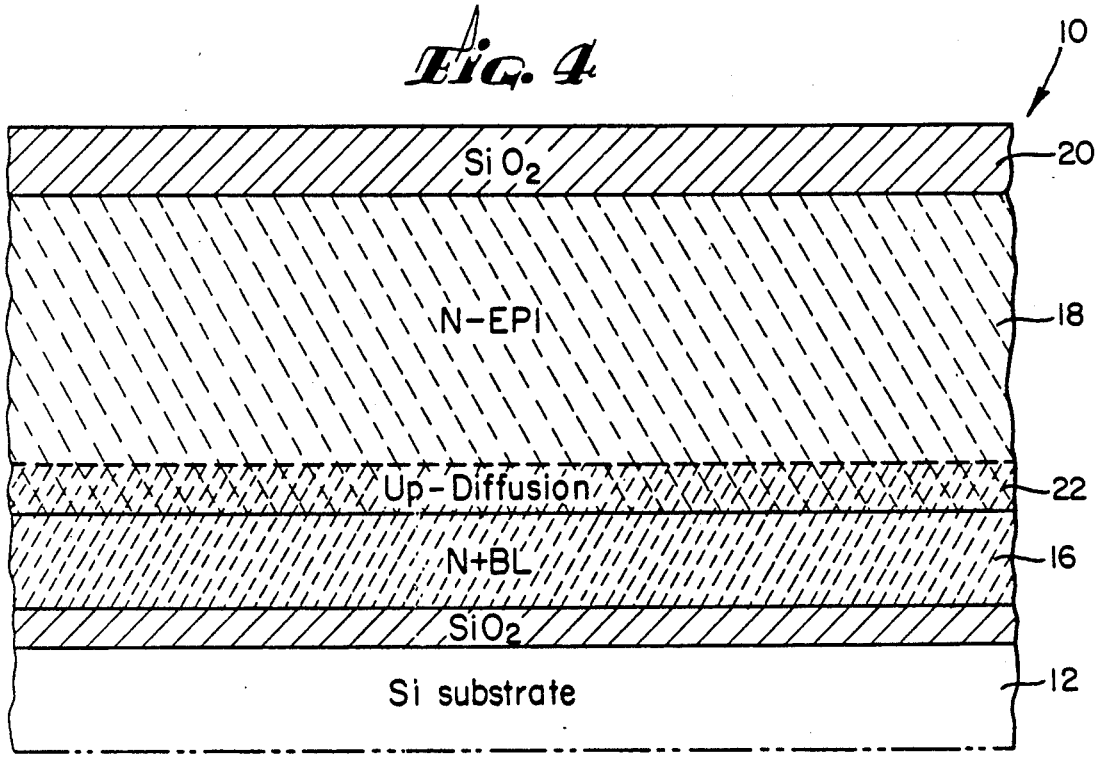
FIG. 4 illustrates the wafer after formation of an oxide layer on top of the second epitaxial layer in accordance of the present invention.

In FIG. 4, wafer 10 is illustrated after formation of an oxide layer 20 on top of the second epitaxial layer 18. Also illustrated in FIG. 4 is a region of increased N+ doping 22 caused by up diffusion of dopant from the N+ buried layer 16. Such up diffusion will in general occur during all subsequent thermal processing steps and, for this reason, the dopant in buried layer 16 was preferably chosen to be Sb due to its lower diffusion coefficient than the more conventional N type dopant.

Figure 5:
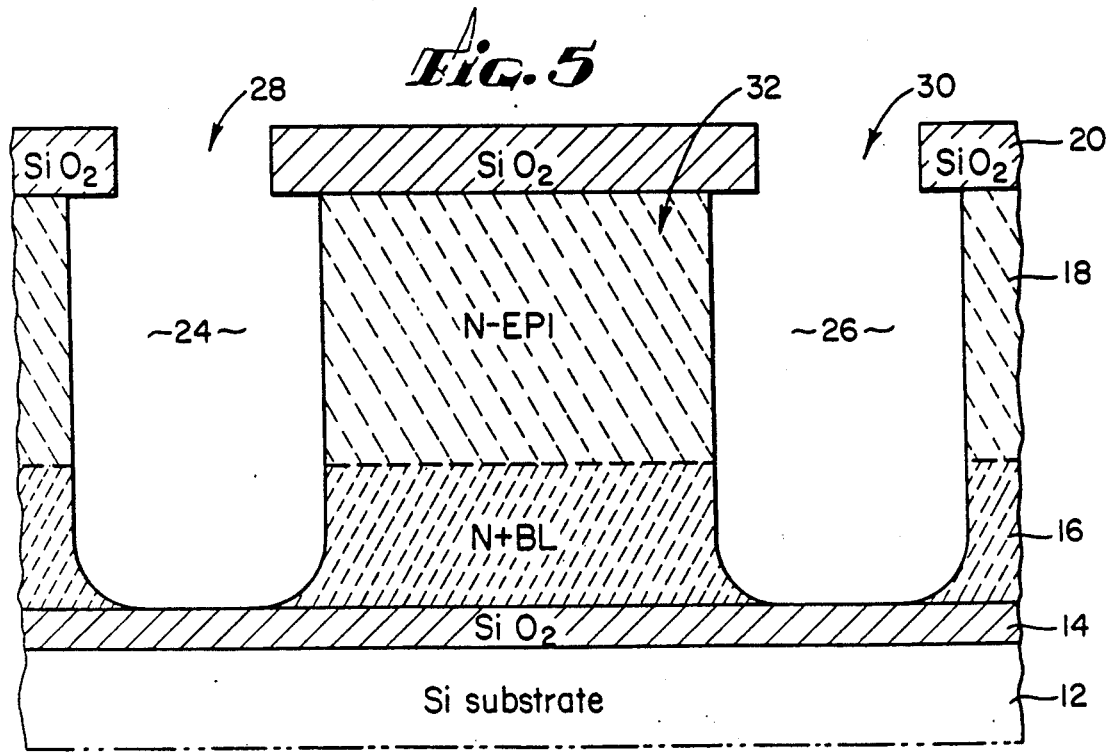
FIG. 5 illustrates the wafer after formation of an isolation trenches etched to isolate the active semiconductor device regions in accordance with the present invention.

Referring to FIG. 5, wafer 10 is illustrated after a masking and reactive ion etching step which opens trench areas 24 and 26. More particularly, conventional masking techniques are employed to open up trench openings 28 and 30 in the $SiO_2$ layer 20. Reactive ion etching is employed to etch the epitaxial layers 18 and 16 down to the underlying oxide layer 14 which acts as natural barrier to the etching process. The depth of trenches 24 and 26 thus corresponds to the combined depth of epitaxial layers 16 and 18, for example, 9 microns in the case of a 7 micron upper epitaxial layer 18 and 2 micron lower layer 16. As illustrated in FIG. 5, due to the nature of the etching process, an overhang will be left of $SiO_2$ over both of the trenches 24 and 26. Also, as shown in FIG. 5, the trench etching step results in an isolated region 32 of epitaxial silicon bounded on top and bottom by $SiO_2$ insulation layers.

Figure 6:
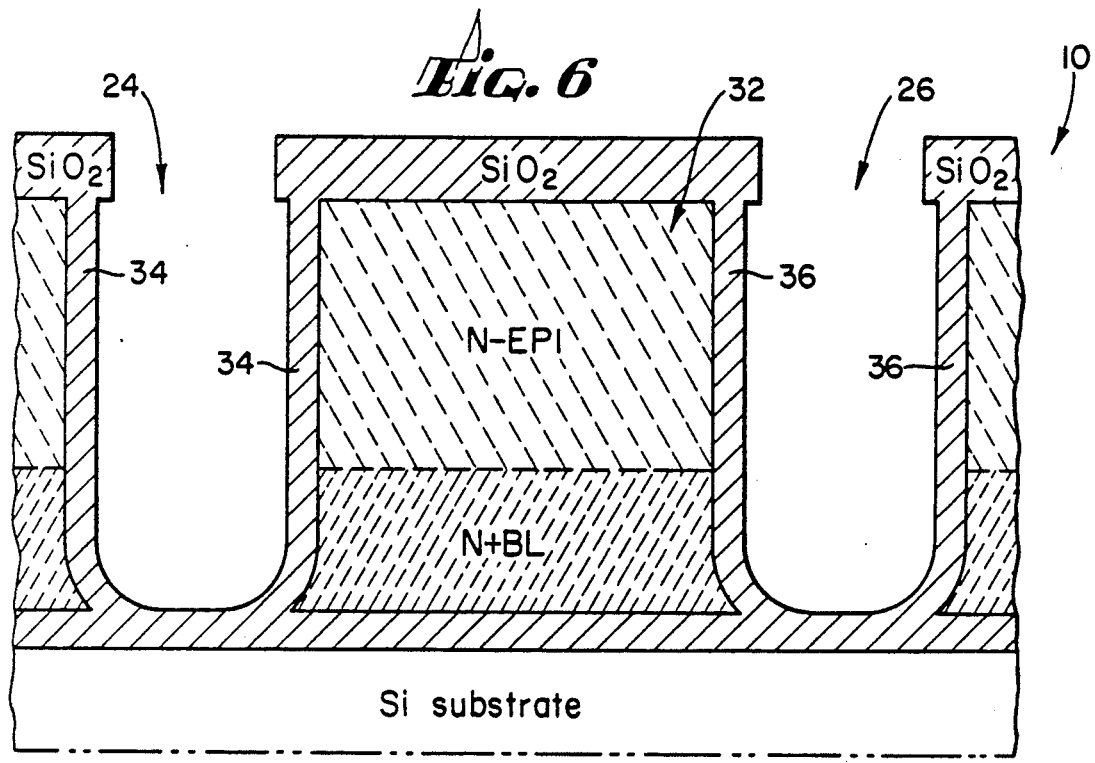
FIG. 6 illustrates the wafer after formation of isolation oxide layer grown around the trench isolated semiconductor regions in accordance with the present invention.

Referring to FIG. 6, wafer 10 is illustrated after a sidewall oxidation of trenches 24 and 26 which leaves $SiO_2$ sidewall layers 34 and 36, respectively in trenches 24 and 26. It will be appreciated from inspection of FIG. 6 that the formation of trench sidewall $SiO_2$ layers 34 and 36 leaves the region of epitaxial silicon 32 completely isolated by oxide on all sides. In a preferred embodiment, the trench sidewall oxide layers 34 and 36 may be, for example, in the range of 5500 Å in thickness. However, it will be appreciated that the oxide layer thickness may be increased to provide increased dielectric isolation. Furthermore, the relative dimensions of all the various layers in regions may be adjusted for the specific application and in accordance with a large number of various design considerations dependent on the specific application. While the third dimension is not illustrated in the figures, a similar dielectric isolation on the front and back sides of the region 32 may be provided to provide full dielectric isolation of region 32. The specific layout of the isolation trenches in the third dimension will typically depend primarily on overall chip layout considerations and thus vary with the number of devices to be provided on the substrate and with the specific application. Also, the width of the isolated region 32 will vary with the specific application. For example, a width of a few microns is possible for very dense device applications, it is also possible to have a width of 20 microns or greater for applications where packing density is less important.

Figure 7:
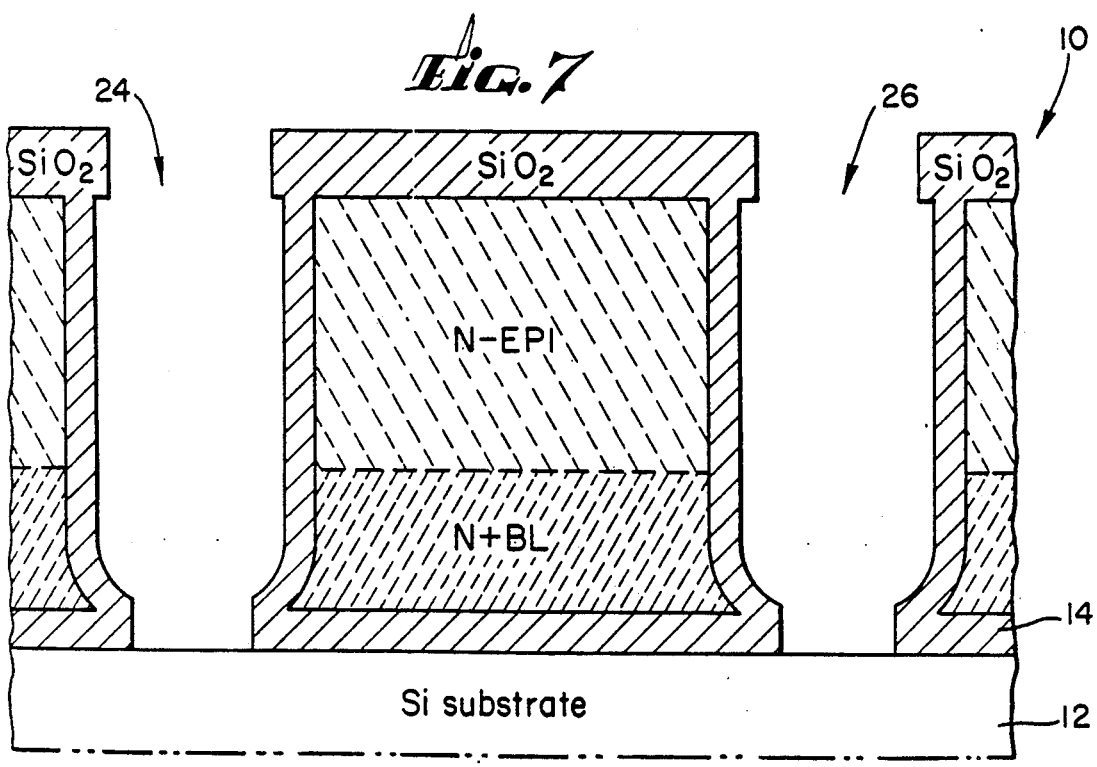
FIG. 7 illustrates the wafer after formation of the trench regions etched through the underlying substrate in accordance with the present invention.

Referring to FIG. 7, wafer 10 is illustrated after an etching step wherein the oxide layer 14 at the bottom of trenches 24 and 26 is etched down to the underlying silicon substrate 12. In this step, an oxide etch is preferably employed which will automatically terminate at the single crystal silicon of substrate 12.

Figure 8:
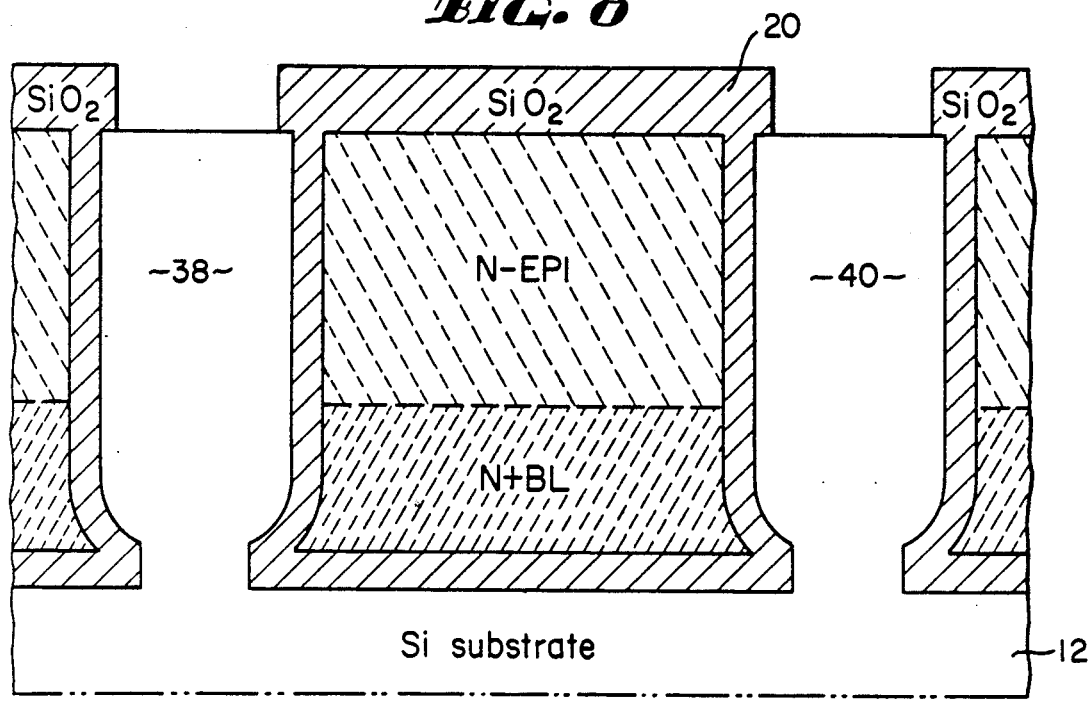
FIG. 8 illustrates the wafer after formation of an epitaxial semiconductor material selectively regrown in the trench regions in accordance with the present invention.

In FIG. 8, the wafer 10 is illustrated after a selective epitaxial regrowth of epitaxial silicon in the trench areas. In this process, the underlying silicon substrate 12 acts as a seed for growth of epitaxial silicon plugs 38 and 40 in the trench regions. The epitaxial regrowth in this region is selective in the sense that the epitaxial silicon is grown only in the trench areas. This may be achieved, for example, by introducing HCl during the epitaxial growth process, which HCl preferentially etches polysilicon over the single crystal silicon growing in the trenches. Thus, the epitaxial silicon being grown in the trenches proceeds to fill the trenches while polysilicon forming on the top $SiO_2$ layer 20 is inhibited. This results in an automatic filling of the trench regions to the surface by the epitaxial silicon plugs 38 and 40 and hence avoids a separate planarization of the regrown trenches with the upper surface of the wafer 10. Other than the selective growth aspect, however, the epitaxial deposition in the trenches may be conventional in nature e.g., utilizing silane gas in a vapor phase deposition process.

The epitaxial silicon plugs 38 and 40 may be employed for different purposes depending on thru specific application. For example, one preferred application is to provide a contact to the underlying wafer substrate 12. In such case, the silicon in regions 38 and/or 40 is preferably doped with a suitable dopant to provide increased conductivity for good electrical contact to the wafer substrate 12. For example, a suitable P type dopant such as boron may be incorporated during the epitaxial regrowth process to form a P+ conductivity in regions 38 and/or 40. Alternatively, a subsequent dopant implant and diffusion step may be employed in one or more regions 38 and 40 to provide the desired electrical conductivity. For other applications, however, for example, thru formation of a vertical semiconductor device in region 38 or 40, a different doping process may be employed. Alternatively, if the epitaxial regrowth is solely desired to provide a means for filling trench regions 24 and 26, then no dopant need be employed.

Figure 9:
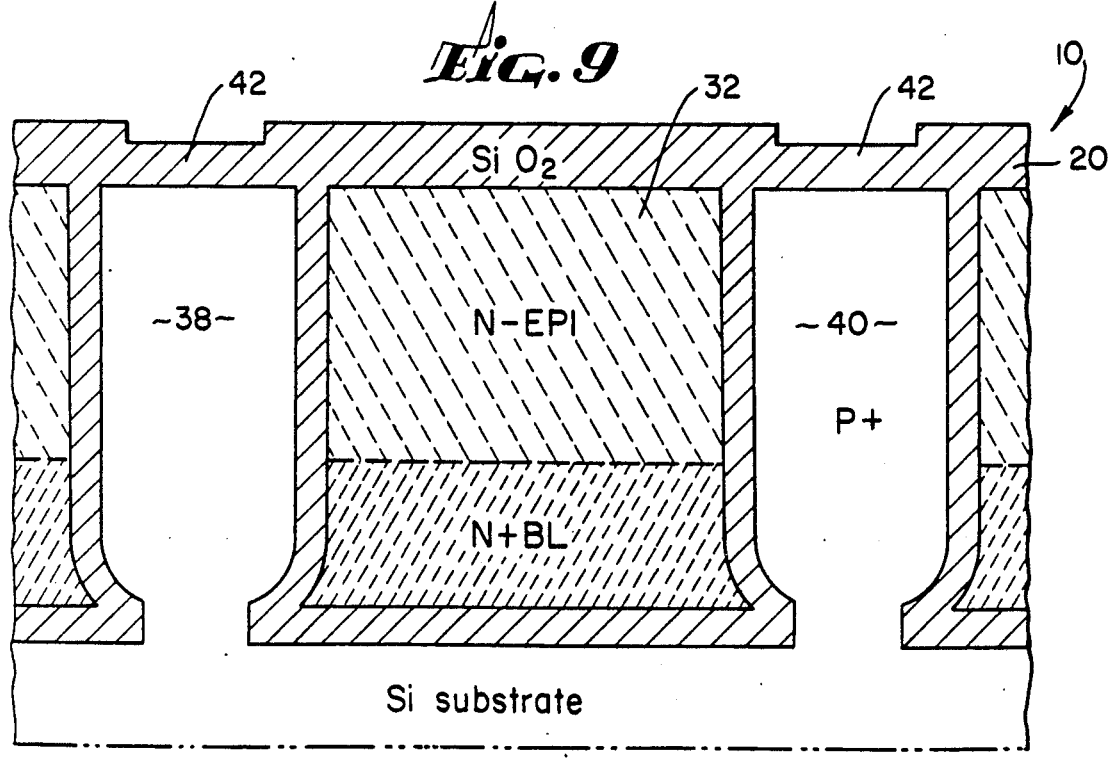
FIG. 9 illustrates the wafer after formation of a layer of oxide formed over the trench regions in accordance with the process of the present invention.

Referring to FIG. 9, wafer 10 is illustrated after an oxidation step to form a layer of $SiO_2$ 42 over the regrown trench regions 38 and 40. Oxide layer 42 may, for example, be approximately 2000-2500 Å thick and serves to cover regions 38 and 40 during subsequent steps in formation of the semiconductor device in isolation region 32.

Figure 10:
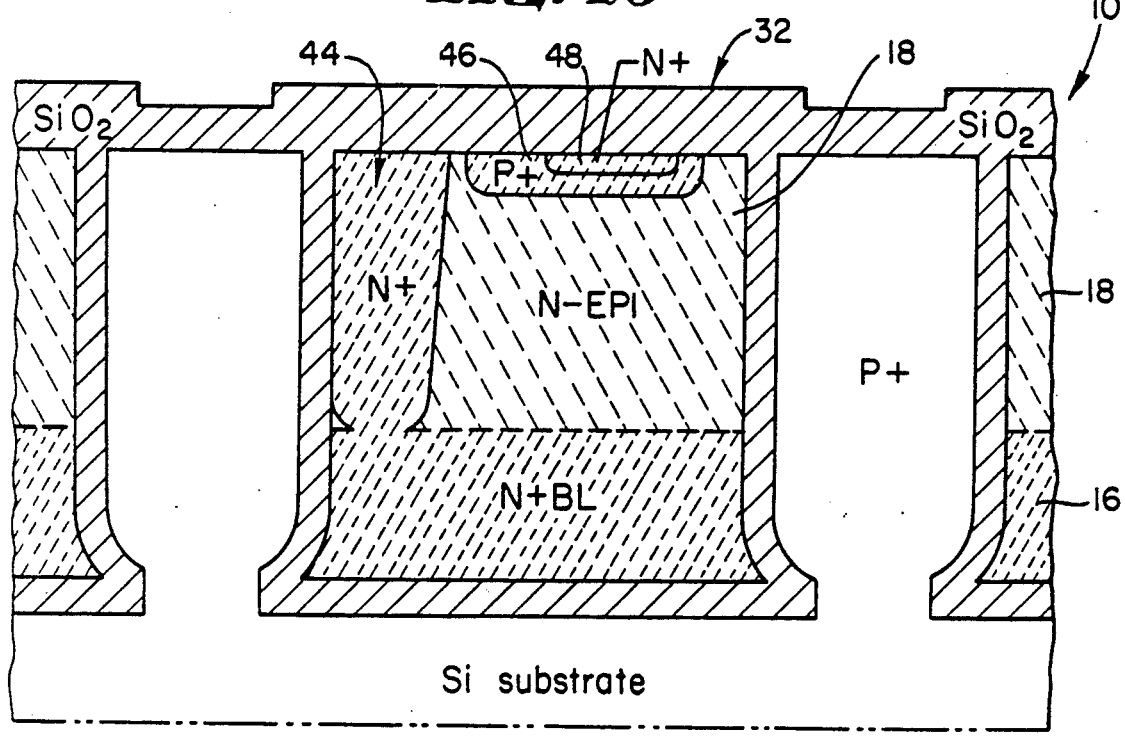
FIG. 10 illustrates the wafer after formation of base, emitter and collector regions in the isolation region in accordance with the present invention.

Referring to FIG. 10, wafer 10 is illustrated after formation of the base, emitter and collector regions of a NPN bipolar device in isolation region 32. Specifically, the collector region is formed by an N+ implant and diffusion to form the deep N+ region 44 which makes contact to the buried N+ layer. Base region 46 is formed by a relatively shallow P+ implant and diffusion into the top of the N− epitaxial layer 18 to a depth of approximately 2 microns. The emitter region 48 in turn is formed by an even shallower N+ implant and diffusion into base region 46. The formation of deep collector implant 44 base region 46 and emitter region 48 may all employ conventional semiconductor masking, implant and diffusion steps. The doping levels for regions 44, 46 and 48 will vary with the specific device requirements for the specific application. For example, in one example, the implant in the regions 44, 46 and 48 may be chosen to give a resistance of approximately 10-15 Ω/sq. for the N+ emitter and collector regions 48, 44 and a resistance of approximately 400 Ω/sq. for base region 46. The base, collector and emitter structures illustrated in FIG. 10 correspond to a generally vertical current flow during transistor operation from emitter 48 vertically down through base 46, to buried layer 16 and up through the collector contact implant 44. It should be appreciated, however, that a lateral configuration and other transistor layout is also possible within dielectrically isolated region 32. Alternatively, various other types of devices may be formed in isolation region 32; for example, by omitting emitter implant 48, a basic diode structure could be formed. Also, as desired for the specific application, a PNP bipolar transistor device, MOS device, CMOS device or BIMOS (combination bipolar and MOS) may also be formed in isolation region 32. Since the formation of such devices in isolation region 32 may proceed along generally conventional semiconductor processing lines, the necessary modifications will be readily apparent to those skilled in the art.

Figure 11:
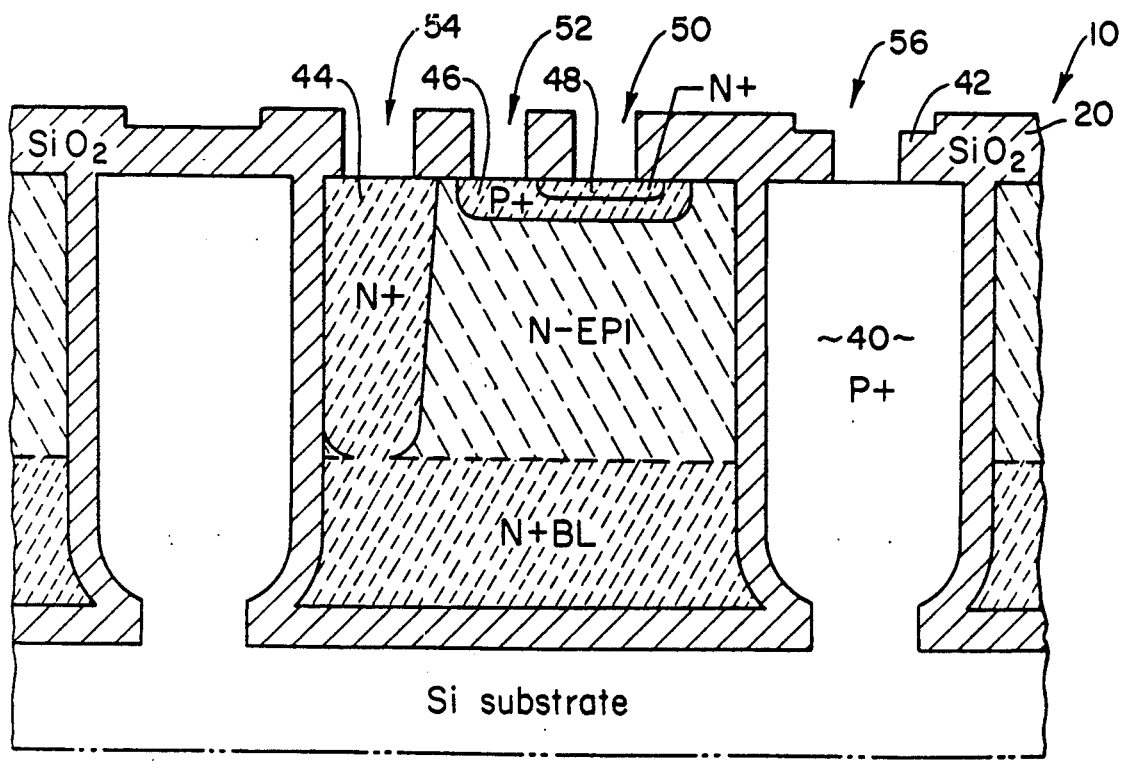
FIG. 11 illustrates the wafer after formation of openings made for electrical contacts to the semiconductor device of base, emitter, collector and trench regions in accordance with the present invention.

Referring to FIG. 11, wafer 10 is illustrated with suitable electrical contact openings made in the oxide layers 20 and 42 to provide electrical contacts to the base, emitter and collector regions and epitaxial regrown trench region 40 for the wafer substrate contact. Specifically, oxide opening 50 is provided over emitter region 48, oxide opening 52 is provided over base region 46, oxide opening 54 over collector contact region 44 and oxide opening 56 over trench plug region 40. These contact openings may be formed by conventional semiconductor patterning and etching methods.

Figure 12:
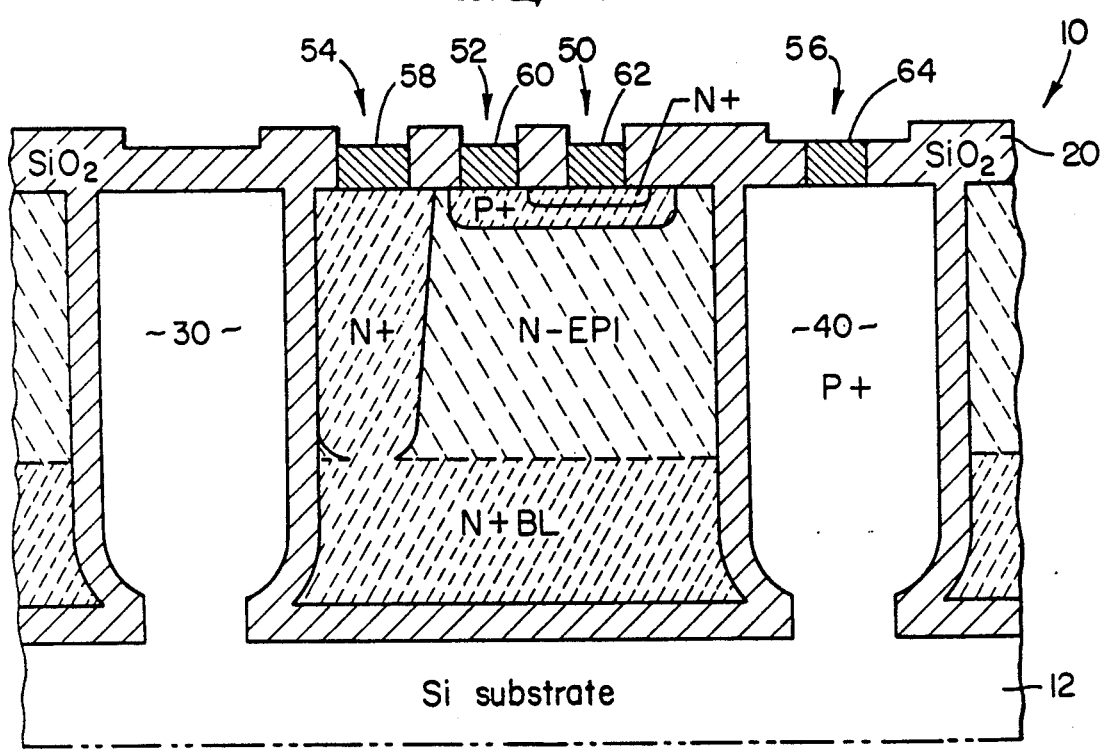
FIG. 12 illustrates the wafer after formation of contact regions and a contact to the trench contact in accordance with the present invention.

Referring to FIG. 12, wafer 10 is illustrated after deposition of metallization contact layers to the base, emitter, collector and trench plug regions. Specifically, as shown in FIG. 12, collector metallization contact 58 is deposited in oxide opening 54, base contact metallization 60 is deposited in oxide opening 52, emitter contact metallization 62 is deposited in oxide opening 50 and trench plug contact metallization 64 is deposited in oxide opening 56. Additional passivation and protective layers (not shown) may also be formed to complete the processing of wafer 10. For example, a layer of photosilicate glass of approximately 3000 Å in thickness and a 1000 Å thick silicon nitride layer may be employed as suitable passivation and protection layers. Various other such layers well known to those skilled in the art may also be employed, however. Further, processing steps to finalize the wafer 10 for the specific application may be employed using a conventional techniques.

As may be appreciated from inspection of FIG. 12, the foregoing process steps result in a completely dielectrically isolated bipolar transistor device. In addition, by virtue of the contact to the epitaxial trench plug 40, good electrical contact is provided to the wafer substrate 12. This combination of features provides a highly radiation hardened device. More specifically, the complete dielectric isolation of the bipolar transistor prevents carrier buildup in the device due to electron/hole pair creation in the wafer substrate 12 during a radiation event. Additionally, the contact to the substrate 12 via the contact metallization 64 and trench plug 40 allows charge built-up in the substrate to be drained away. This prevents extensive charge buildup which may eventually cause failure of the semiconductor device due to surface charge effects. Alternatively, the contact to the substrate 12 may be employed to provide a convenient interchip electrical connection to selected devices.

The dielectrically isolated semiconductor device provided by the present invention and as illustrated by the bipolar transistor in FIG. 12 further possesses the capability to withstand high voltages and/or currents applied to the wafer 10. More specifically, due to the complete dielectric isolation of the semiconductor device provided by the surrounding oxide layers, high voltages may be applied to portions of the integrated circuit chip without causing breakdown in the isolated semiconductor device. This allows effective integration of high and low voltage (and/or power) devices on a single chip. This feature may be advantageously combined with the epitaxial silicon formed in the trench regions by providing vertical bipolar transistors in the trench regions to provide high current capability vertically through the device which could in turn be combined with low power logic semiconductor devices or other low power devices in the dielectrically isolated regions. Other high power and high voltage applications may also advantageously employ the dielectrically isolated active device regions and/or the epitaxial trench regions providing contact to the wafer substrate region.

A further advantageous feature of the dielectrically isolated semiconductor device provided by the present invention is the capability to withstand high temperature operation. For example, operation at temperatures as high as 300° C. may be achieved without thermal breakdown of the isolated semiconductor device. This has significant advantages in applications having a potential exposure to extreme operating conditions, for example, certain military and industrial applications.

In yet a further feature of the dielectrically isolated semiconductor device provided by the present invention is the high frequency capabilities of the device. In particular, dielectrically isolated bipolar devices in accordance with the present invention can achieve very high speed, for example, operating into the GHz range. This is due to the reduced capacitance between the metallization layers driving the device and the isolation oxide, as compared to interaction with the substrate in non-isolated devices.

It will further be appreciated that the present invention is fully compatible with conventional semiconductor processing techniques and may be readily implemented in the cost effective manner.

While the present invention has been described in conjunction with a specific example for convenience of illustration, it will be appreciated by those skilled in the art that a wide range of variations are possible while remaining within the scope of the present invention. In particular, the specific type of semiconductor device formed in the dielectrically isolated region, the specific conductivity types employed during formation of the various regions on the wafer, the number and configuration of the dielectrically isolated regions, the dimensions of the various regions, and the details and sequence of the specific steps may all be varied while remaining within the scope of the present invention. Accordingly, the foregoing description should be taken as purely illustrative.

What is claimed is:

1. A method for forming a dielectrically isolated active device region on a wafer having a monocrystalline semiconductor substrate, a layer or insulator formed on said substrate, and a first epitaxial layer of a semiconductor material on said layer of insulator, comprising the steps of:

etching a plurality of trench regions in said first epitaxial layer so as to extend to said layer of insulator;

forming a layer of insulator on the sidewalls of said trench regions, wherein the layers of insulator define at least one dielectrically isolated region;

etching the bottom of the trenches so as to expose the underlying semiconductor substrate; and forming an additional epitaxial semiconductor layer in said trench regions such as to contact the underlying monocrystalline semiconductor substrate.

2. A method as set out in claim 1, wherein the semiconductor substrate material is silicon and the dielectrically isolated active device region is insulated by an insulator layer formed of $SiO_2$.

3. A method as set out in claim 2, further comprising the steps, before said step of etching a plurality of trench regions, of:

doping said first epitaxial layer with a predetermined conductivity type dopant material; and forming a second epitaxial layer of said semiconductor material on top of said epitaxial layer.

4. A method as set out in claim 3, wherein said dopant material is Sb.

5. A method as set out in claim 2, wherein the step of forming an additional epitaxial semiconductor material in said trench regions comprises epitaxially growing said semiconductor material in said trench regions while simultaneously selectively etching semiconductor material not formed in said trench regions.

6. A method as set out in claim 1, further comprising the step of doping the epitaxial semiconductor material in said trench regions so as to provide an electrical contact to the semiconductor substrate.

7. A method as set out in claim 1, further comprising the step of forming an active semiconductor device in said at least one dielectrically isolated region.

8. A method as set out in claim 7, wherein said active semiconductor device is an NPN bipolar transistor.

9. A method as set out in claim 7, wherein said active semiconductor device is an PNP bipolar transistor.

10. A method as set out in claim 7, wherein said active semiconductor device is a diode.

11. A method as set out in claim 7, wherein said active semiconductor device is a metal oxide semiconductor field effect transistor.

12. A method for forming a semiconductor device on a semiconductor wafer, comprising the steps of:

providing a wafer of monocrystalline semiconductor material, said wafer having an insulator layer formed of an oxide of the semiconductor material;

providing a monocrystalline epitaxial layer of said semiconductor material on top of said insulator layer;

forming a plurality of trenches in said epitaxial layer, said trenches extending from the upper surface of the epitaxial layer to the insulator layer;

forming a layer of insulator on the sidewalls of said trenches;

providing an opening in the insulator layer in the bottom of one or more of said trenches so as to provide an opening to the underlying wafer substrate;

selectively epitaxially growing said semiconductor material in said one or more trenches from said underlying monocrystalline wafer substrate to the top of said trench; and forming an active semiconductor device in at least one isolation region defined by the trenches.

13. A method as set out in claim 12, wherein said insulative layer surrounding the dielectrically isolated active device is approximately 1000 Å thick.

14. A method as set out in claim 12, wherein said epitaxial layer is approximately 9 microns thick.

15. A method as set out in claim 12, wherein said isolation region is approximately 20 microns wide.

16. A method as set out in claim 12, further comprising the step of doping the epitaxial material formed in said at least one trench region with a dopant to provide a predetermined conductivity type.

17. A method as set out in claim 16, wherein the semiconductor material is silicon and wherein the predetermined conductivity type is P+ and wherein the conductivity of said trench region is approximately 10-15 ohms/square.

18. A method as set out in claim 12, wherein said step of forming a semiconductor device comprises the steps of:

forming a buried layer of a first conductivity type in the bottom portion of the isolation region above the insulator layer;

forming a second layer of said first conductivity type having a lower conductivity and formed above said buried layer;

providing a collector contact region of said first conductivity type extending from the top surface of the isolation region to the buried layer;

forming a base region of a second conductivity type in said second layer of said first conductivity type; and forming a shallow emitter region of said first conductivity type material in said base region;

wherein said regions collectively define a vertical bipolar transistor device.

19. A method as set out in claim 18, wherein the first conductivity type is N type silicon and the second conductivity type is P type silicon.

* * * * *